(12) United States Patent  
Hasenberg et al.

(10) Patent No.: US 7,782,920 B2
(45) Date of Patent: Aug. 24, 2010

(54) EDGE-EMITTING SEMICONDUCTOR LASER WITH PHOTONIC-BANDGAP STRUCTURE FORMED BY INTERMIXING

(75) Inventors: Thomas C. Hasenberg, Campbell, CA (US); Jason P. Watson, San Jose, CA (US)

(73) Assignee: Coherent, Inc., Santa Clara, CA (US)

( * ) Notice: Subject to any disclaimer, the term of this patent is extended or adjusted under 35 U.S.C. 154(b) by 56 days.

(21) Appl. No.: 12/330,304

(22) Filed: Dec. 8, 2008

(65) Prior Publication Data
US 2010/0142575 A1    Jun. 10, 2010

(51) Int. Cl.
*H01S 5/00* (2006.01)
(52) U.S. Cl. ............... 372/46.016; 372/43.01; 372/46.011; 372/46.014; 372/64
(58) Field of Classification Search .............. 372/43.01, 372/46.011, 46.014, 46.016
See application file for complete search history.

(56) References Cited

U.S. PATENT DOCUMENTS

| 5,684,817 | A | * | 11/1997 | Houdre et al. ........... 372/45.01 |
| 6,674,778 | B1 | * | 1/2004 | Lin et al. ................. 372/46.01 |
| 6,711,200 | B1 | * | 3/2004 | Scherer et al. ................ 372/64 |
| 6,984,538 | B2 | | 1/2006 | Ooi et al. ...................... 438/22 |
| 7,042,014 | B2 | | 5/2006 | Sugitatsu et al. ............. 257/79 |

* cited by examiner

*Primary Examiner*—Dung T Nguyen
(74) *Attorney, Agent, or Firm*—Morrison & Foerster LLP

(57) ABSTRACT

A separate-confinement heterostructure, edge-emitting semiconductor laser having a wide emitter width has elongated spaced apart intermixed and disordered zones extending through and alongside the emitter parallel to the emission direction of the emitter. The intermixed zones inhibit lasing of high order modes. This limits the slow axis divergence of a beam emitted by the laser.

10 Claims, 7 Drawing Sheets

EDGE-EMITTING SEMICONDUCTOR LASER WITH PHOTONIC-BANDGAP STRUCTURE FORMED BY INTERMIXING

TECHNICAL FIELD OF THE INVENTION

The present invention relates in general to edge-emitting semiconductor lasers. The invention relates in particular to wide-stripe, edge-emitting semiconductor lasers having photonic-bandgap regions to suppress emission of high-order modes.

DISCUSSION OF BACKGROUND ART

An edge-emitting semiconductor laser (diode-laser) is formed by defining an emitting region in a separate-confinement heterostructure epitaxially grown on a single-crystal substrate. The emitting region is commonly referred to as a "stripe" by practitioners of the art. The strip typically has a length between about 1.0 and 1.5 millimeters (mm), and emits radiation from an emitting "aperture" having a height of about 1.0 micrometer (µm) and a width between about 4 µm and 200 µm. The aperture width is usually referred to in the art as the emitter-width or stripe-width. A diode-laser having an emitter-width greater than about 30 µm is often referred to as a wide-emitter or wide-stripe diode-laser.

Generally, for a given length of a diode-laser, the greater the stripe (emitter) width, the greater will be the potential output power of the diode-laser. However, the greater the stripe width, the greater is the number of transverse modes at which the laser delivers output radiation. The greater the number of transverse modes, the poorer is the quality of the output beam of the diode-laser. While a multiple transverse mode output beam is acceptable for diode-laser applications such a heating and surface treatment, it is often not suitable for applications in which the output beam must be focused into a small spot, for example in end-pumping a fiber laser. There is a need for a separate confinement heterostructure that provides for improved beam-quality in a wide-stripe diode-laser.

SUMMARY OF THE INVENTION

In one aspect of the present invention a wide stripe diode-laser (edge emitting semiconductor laser) comprises a separate confinement heterostructure. The heterostructure has an active region including an active layer located between upper and lower waveguide layers. The active region is located between upper and lower cladding layers. The active, waveguide and cladding layers are ordered crystalline epitaxially-grown layers. A cap layer is located above a region of the upper cladding layer and defines a resonator region in the active region. The resonator region has a slow-axis parallel to the plane of the layers therein, a fast-axis perpendicular to the slow-axis, a longitudinal axis perpendicular to the fast- and slow-axes and first and second opposite sides parallel to the longitudinal axis. A plurality of elongated disordered regions is formed in at least one ordered crystalline waveguide layer of the active region. The disordered regions are spaced apart from each other, extend parallel to the longitudinal axis of the resonator region, and are located at least outside of the resonator region on both opposite sides thereof.

The disordering of the elongated regions in the waveguide layer provides that the regions have a refractive index lower that of the waveguide layer. The disordered regions may extend through the active region from the upper waveguide layer to the lower waveguide layer. The terms upper and lower are used with reference to layers of the heterostructure for convenience of illustration and should not be construed as meaning that the inventive laser must be used in any particular orientation.

BRIEF DESCRIPTION OF THE DRAWINGS

The accompanying drawings, which are incorporated in and constitute a part of the specification, schematically illustrate a preferred embodiment of the present invention, and together with the general description given above and the detailed description of the preferred embodiment given below, serve to explain principles of the present invention.

DETAILED DESCRIPTION OF THE INVENTION

Figure 1:
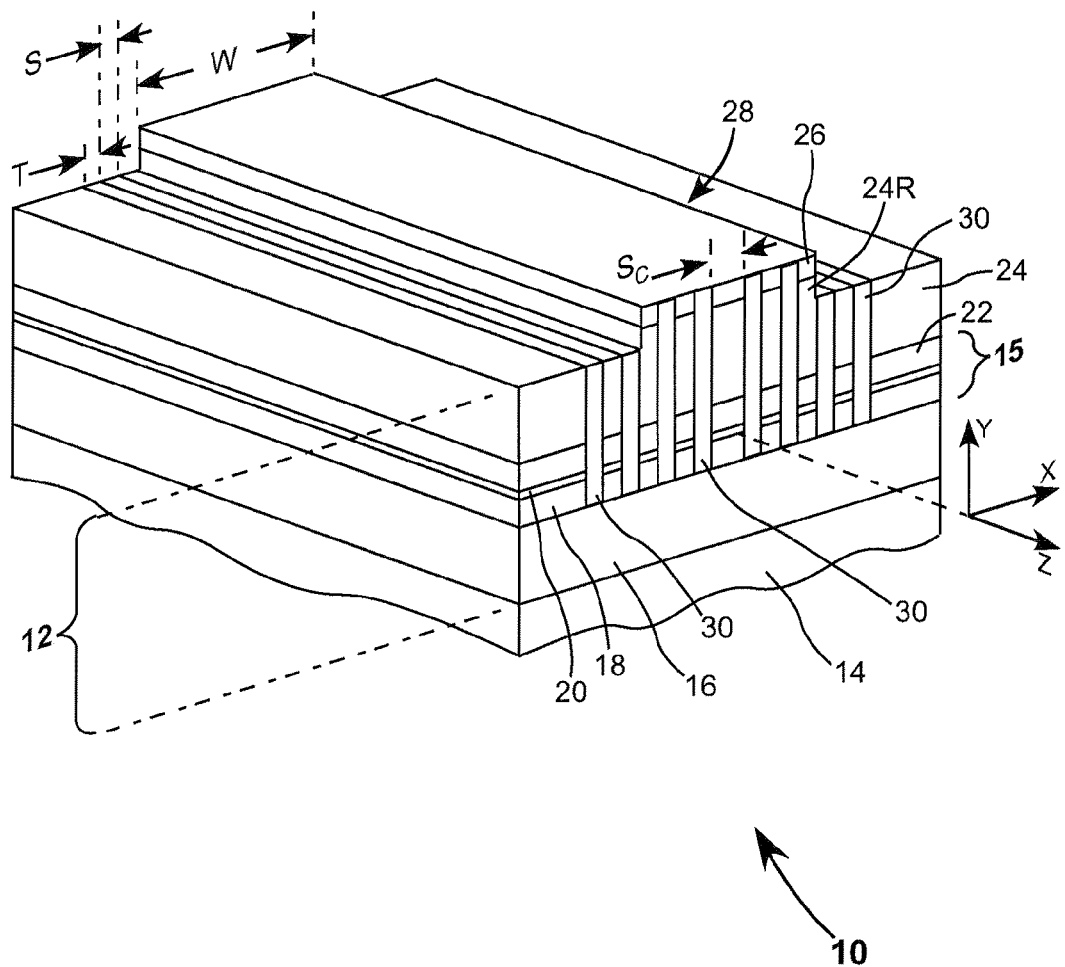
FIG. 1 is a three dimensional view schematically illustrating one preferred embodiment of an edge-emitting semiconductor laser structure in accordance with the present invention, including a separate confinement heterostructure having an active region including a quantum well layer bounded by upper and waveguide layers, the waveguide layers bounded in turn by upper and lower cladding layers, with a photonic bandgap structure including longitudinally-extending, spaced-apart and parallel, intermixed zones extending from the upper cladding layer fully through the active region in planes perpendicular to the planes of the layers of the heterostructure.

Referring now to the drawings, wherein like components are designated by like reference numerals, FIG. 1 schematically illustrates one preferred embodiment 10 of an edge-emitting semiconductor laser structure in accordance with the present invention. Laser 10 includes including a separate-confinement heterostructure 12 epitaxially grown on a semiconductor substrate 14.

Heterostructure 12 includes a lower cladding (electrical confinement) layer 16, surmounted by a lower waveguide (optical confinement) layer 18 surmounted in turn by an active or quantum-well (QW) layer 20. The QW layer is surmounted by an upper waveguide layer 22 which in turn is surmounted by an upper cladding layer 24. The combination 15 of the waveguide layers and the active region of a separate confinement heterostructure is often referred to by practitioners of the art as the active region of a the heterostructure.

A portion 24R of the upper cladding layer extends above the remainder of the layer and that upwardly-extending cladding layer portion is surmounted by a heavily doped cap (or contact layer 26) to which electrical contact can be made, for example via an applied layer of metallization (not shown), the combination forming a ridge 28 on the heterostructure. An anode connection (not shown) is made to the cap layer and a cathode connection is made to the substrate.

The portion of the active region under ridge 28 forms the resonator region (cavity) of the laser which has a width of about W corresponding to the width of the ridge (cap layer). Width W is commonly referred to as the "stripe width" by practitioners of the art. Laser radiation is emitted from the end of the resonator generally along a propagation-axis designated the Z-axis in FIG. 1. Mutually perpendicular X- and Y-axes are typically referred to respectively as the slow- and fast-axes by practitioners of the art. The Z-axis is the longitudinal axis of the resonator region.

A photonic bandgap structure is formed in the heterostructure by longitudinally-extending, spaced-apart and parallel, intermixed (disordered) zones 30 extending from the upper cladding layer (and the cap layer) fully through the active region in planes parallel to the Y-Z plane of the heterostructure, i.e., perpendicular to the planes of the layers of the heterostructure which are parallel to the X-Z plane. These zones are formed by a diffusion mechanism described in detail further hereinbelow. As an artifact of this diffusion mechanism the edges of the zones have a lower refractive index than the material between the zones and the zones provide for index guiding of lasing modes in the slow-axis, i.e., in the X-Z plane.

In a conventional edge-emitting heterostructure, the wider the stripe-width the greater will be the number of higher order modes that the resonator will support and the greater will be the divergence of the output radiation. This guiding action of zones 30 inhibits lasing of high-order modes and limits the beam divergence while still providing the high output power of a wide-stripe heterostructure. In the case of a heterostructure having an arrangement and composition for delivering radiation in a wavelength range between about 700 nm and 1100 nm, zones 30 preferably have a width T between about 10 and 50 µm. The zones are spaced-apart by a distance S preferably between about 70 and 100 µm. The spacing $S_C$ between the inner most zones on either side of the resonator-axis is preferably has a somewhat larger than the spacing between the other zones.

In laser 10, only eight zones 30 are depicted for convenience of illustration, with 4 zones being within the resonator width W. In practice, for a resonator width W of about 50 µm there are preferably no zones in the resonator width, thereby forming an essential defect in an otherwise periodic structure, and there are preferably at least 10 zones on either side of the resonator width.

Further in laser 10, zones 30 extend fully into the active region, i.e., to the lower boundary of the lower cladding layer. While this is an ideal situation, in practice it may be found preferable to have zones 30 extend only into the upper waveguide-layer, for example as far as QW layer 20. Such an arrangement is depicted as laser 10A in FIG. 1A.

Figure 1A:
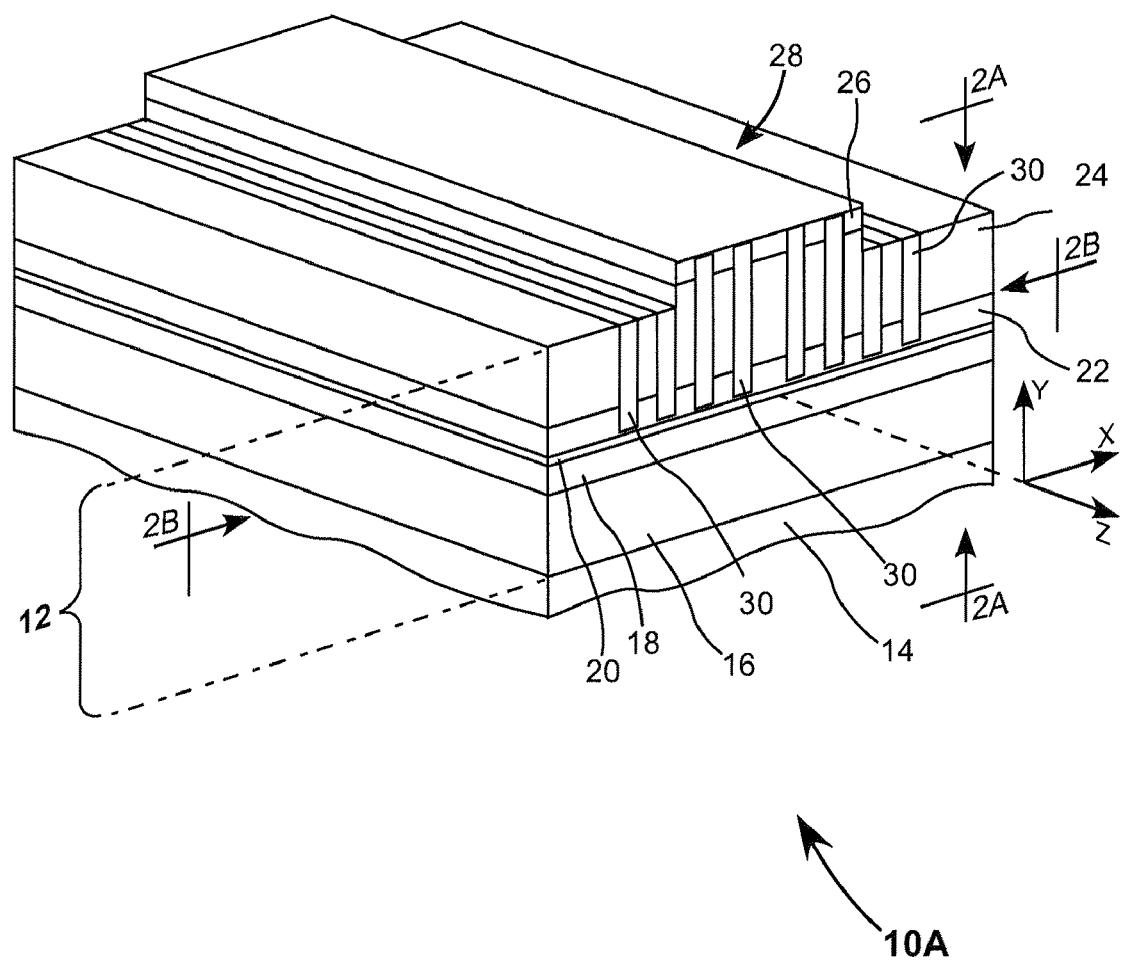
FIG. 1A is a three dimensional view schematically illustrating another preferred embodiment of an edge-emitting semiconductor laser structure in accordance with the present invention, similar to the structure of FIG. 1 but wherein the intermixed zones extend from the upper cladding layer only into the upper waveguide layer of the active region of the heterostructure.
Figure 2A:
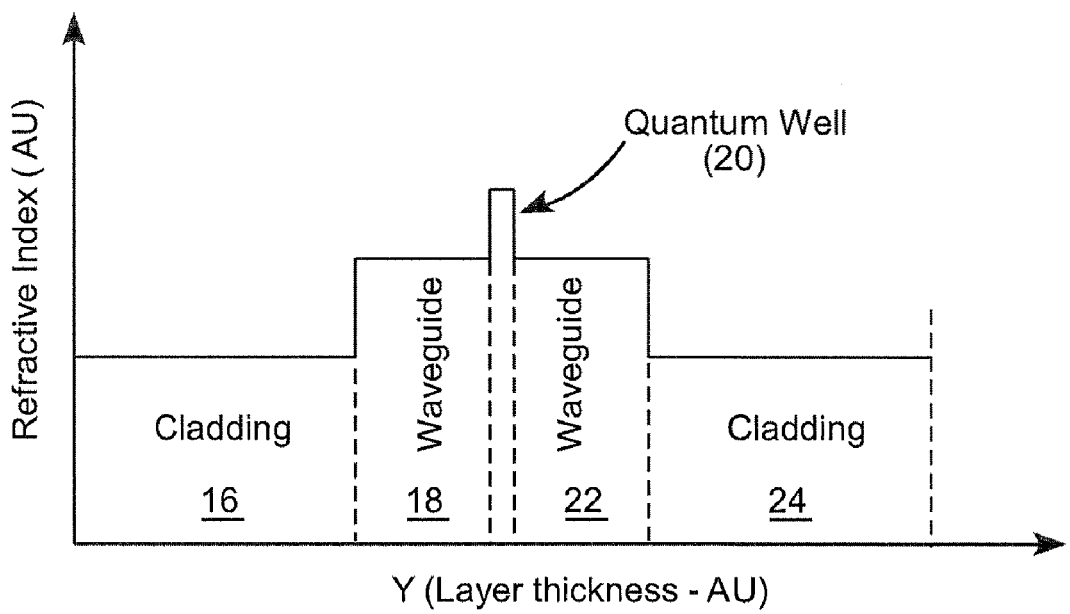
FIG. 2A is an exemplary refractive index profile of the heterostructure of FIG. 1A seen generally in the direction 2A-2A of FIG. 1A perpendicular to the layers of the heterostructure.

FIG. 2A schematically illustrates refractive index as a function of thickness in the Y-axis direction through heterostructure 12 of the laser of FIG. 1A between intermixed zones 30 thereof. Here, the cladding layers 16 and 24 have a refractive index less than waveguide layers 18 and 22. Waveguide layers 18 and 22, in turn have a refractive index less than QW layer 20. This refractive index profile is typical of conventional edge emitting lasers.

Figure 2B:
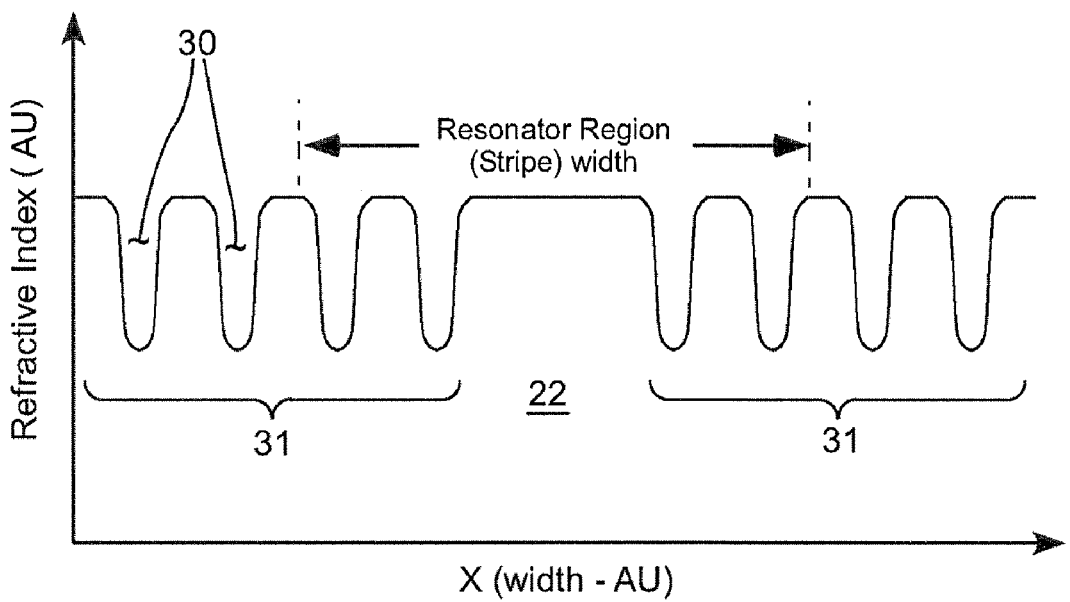
FIG. 2B is an exemplary estimated refractive index profile of the heterostructure of FIG. 1A seen generally in the direction 2B-2B of FIG. 1A in a plane extending through the upper waveguide layer of the heterostructure in a plane parallel to the layer.

FIG. 2B schematically illustrates refractive index as a function of thickness in a plane parallel to the X-Z plane through upper waveguide 22 of the laser of FIG. 1A. It can be seen that the lateral index profile in the X-direction is periodic in nature with a defect in the periodicity. The defect in this instance is created by a central high-refractive index (non-intermixed) zone that is wider (in the X-direction) than non-intermixed zones away from the central zone. In effect there are two groups of low-refractive zones 31 symmetrically distributed about the resonator axis It should be noted here that heterostructure 12 is depicted for convenience of illustration as a simplest form of a separate-confinement heterostructure. Principles of the present invention, however, can be applied to more complex separate-confinement heterostructures without departing from the spirit and scope of the present invention. In such heterostructures, single QW layer 20 may be replaced by be two or more QW layers separated by potential barrier layers. Single waveguide layers 18 and 22 and cladding layers 24 may also be replaced by two or more layers. Edge-emitting semiconductor lasers having separate-confinement heterostructures including such compound QW, waveguide, and cladding layers are described in U.S. Pat. No. 5,889,805, assigned to the assignee of the present invention, and the complete disclosure of which is hereby incorporated by reference.

FIGS. 3A-H schematically illustrate steps in the fabrication of an example of the heterostructure of FIG. 1A. In this example it is assumed that the heterostructure is epitaxially grown on an n-type gallium arsenide (GaAs) substrate. It is assumed that the QW layer, the waveguide layers, and the cladding layers are layers of aluminum gallium arsenide (AlGaAs) with QW layer 20 having a composition $Al_zGa_{(1-z)}As$; waveguide layers 18 and 22 having a composition $Al_yGa_{(1-y)}As$; and cladding layers 16 and 24 having a composition $Al_xGa_{(1-x)}As$, where x>y>z. Alternatively an indium gallium arsenide (InGaAs) quantum-well layer could be employed.

Cap layer 26 is assumed to be a layer of p-type gallium arsenide. Cladding layer 16 is n-doped, for example doped with silicon (Si) and cladding layer 24 is p-doped for example doped with beryllium (Be). Preferred thicknesses for the QW layer are between about 40 nm and 200 nm. Preferred thicknesses for waveguide layers are between about 100 nm and 1000 nm. Preferred thicknesses for cladding layers are between about 1000 nm and 2500 nm. A preferred thickness for cap layer 26 is between about 20 nm and 300 nm.

In a first step (see FIG. 3A) layers 16, 18, 20, 22, 24, and 26 are epitaxially grown on substrate 14. Then a layer 32 of undoped silicon nitride ($SiN_x$) having a thickness of about 100 nm is deposited on the cap layer (see FIG. 3B). Slots 34 are etched through the $SiN_x$ layer partially into the cap layer in locations where zones 30 are desired (see FIG. 3C). Next layers 36 and 38 of respectively arsenic-doped silicon (Si) and arsenic doped $SiN_x$ are deposited over the etched $SiN_x$ layer (see FIG. 3D). Layer 36 preferably has a thickness between about 40 nm and 100 nm. Layer 38 preferably has a thickness between about 50 nm and 150 nm.

After layers 36 and 38 have been deposited the structure is heated to a temperature of between about 775° C. and 850° C. and maintained at that temperature for about 10 Hours. During the period at the high temperature silicon and arsenic from layers 36 and 38 diffuse into the heterostructure forming intermixed zones 30 (see FIG. 3E). The arsenic assists the diffusion of the silicon by creating Group-III vacancies in the crystal lattice of the layers of the heterostructure. The duration of the heating period is selected according to the depth in the heterostructure that the intermixed zones are required to reach. Some lateral extension of the diffusion process is to be expected providing slightly bowed sides of the zones. In the diffusion process gallium or indium is displaced by aluminum creating a region of lower refractive index. This provides for some gradation of the refractive index at the edges of the zones as noted in the graph of FIG. 2B.

Figure 3A:
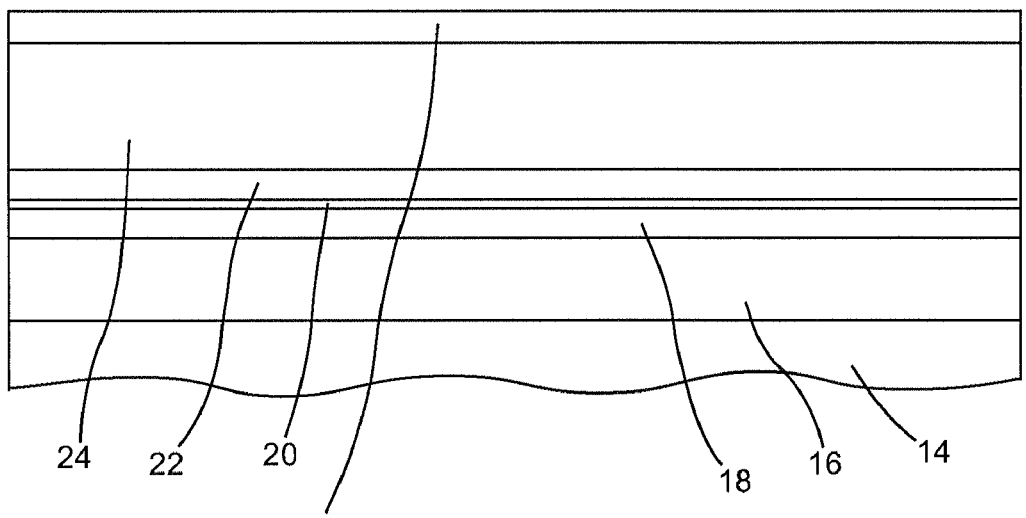
FIGS. 3A-H schematically illustrate steps in the fabrication of an example of the heterostructure of FIG. 1A.
Figure 3B:
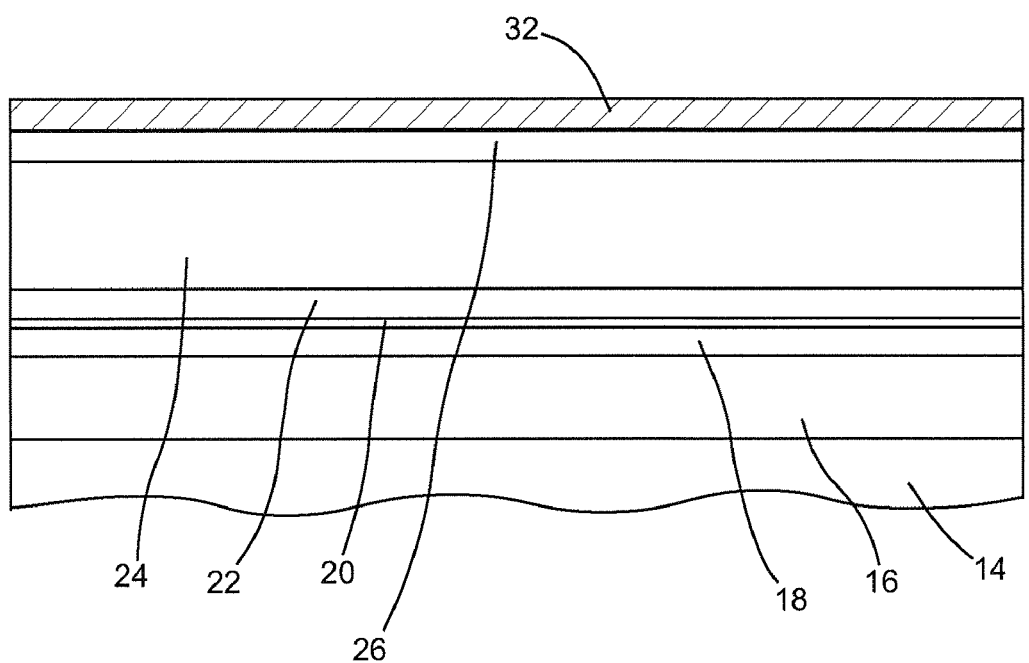
Figure 3C:
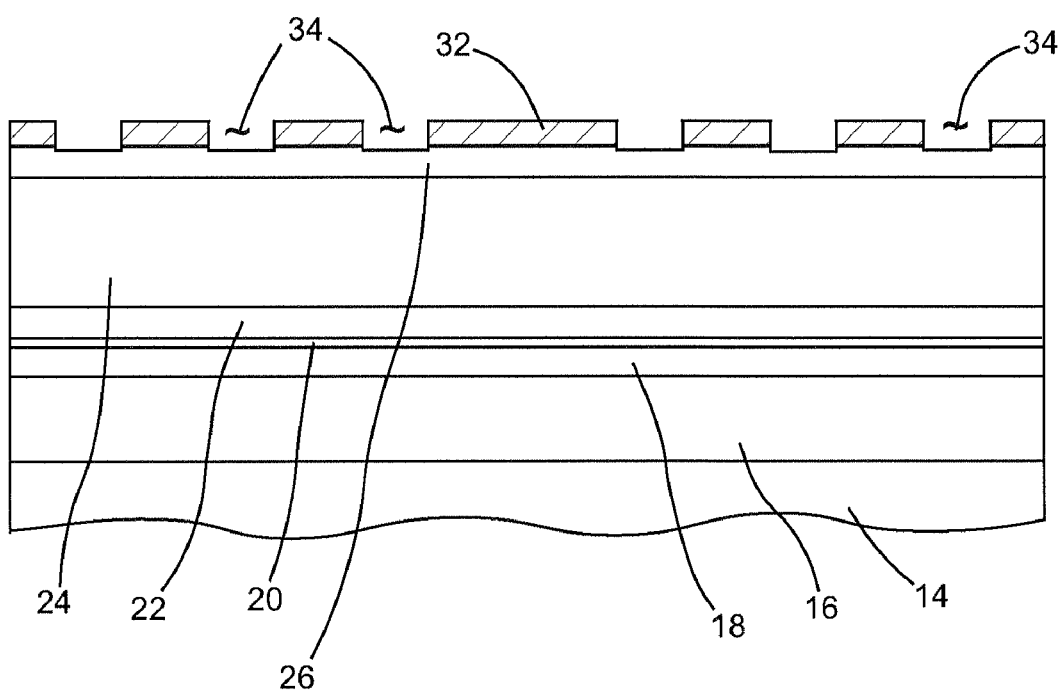
Figure 3D:
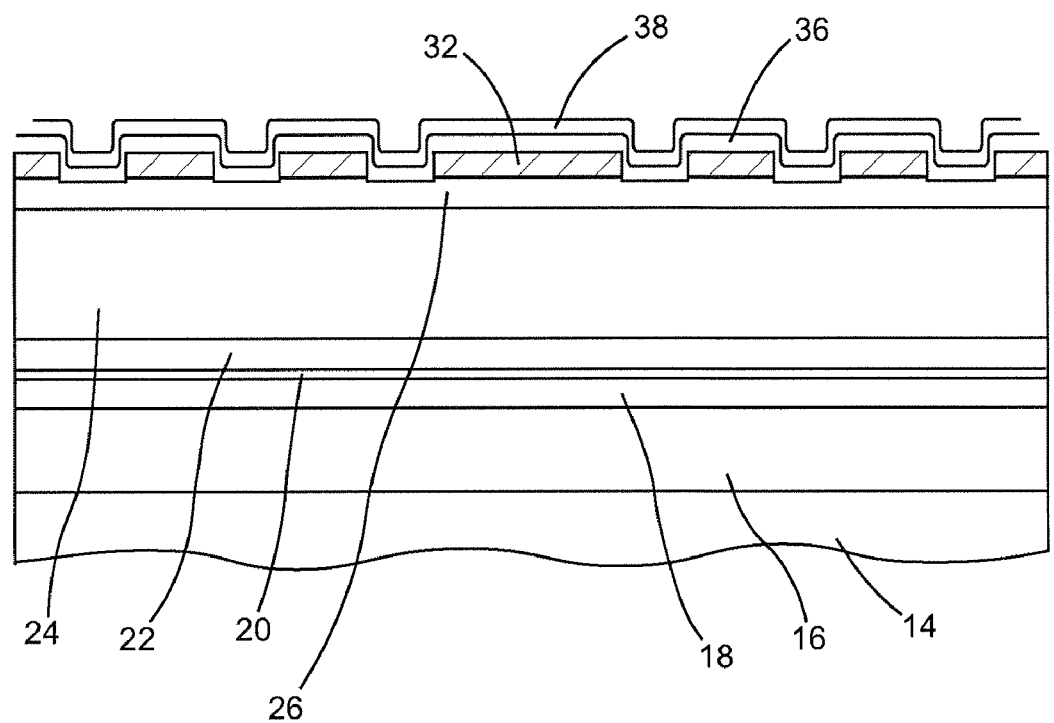
Figure 3E:
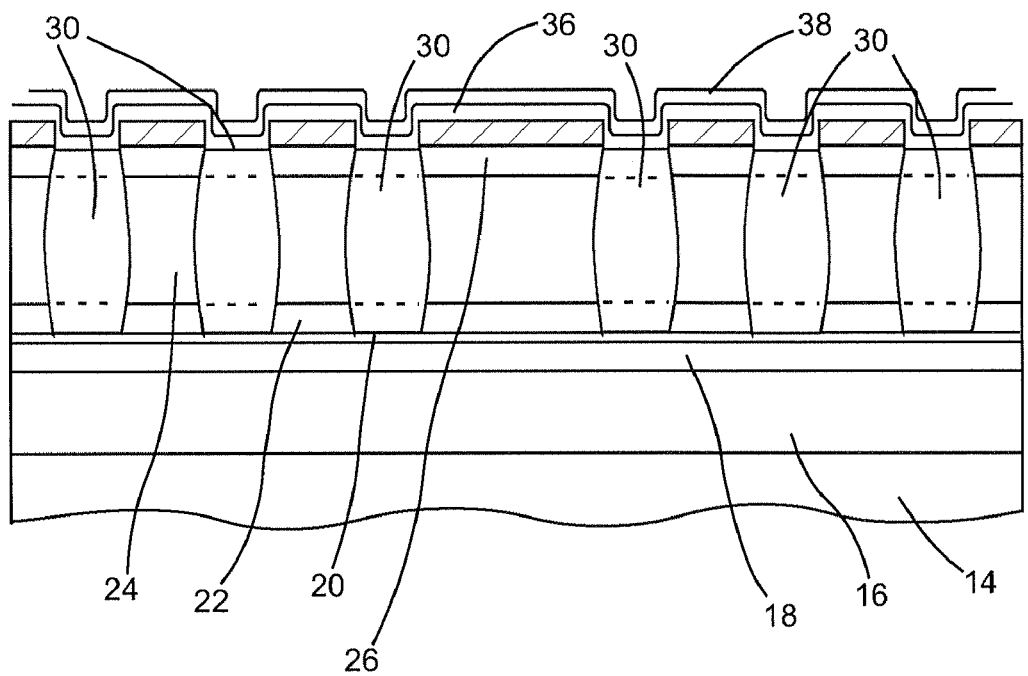
Figure 3F:
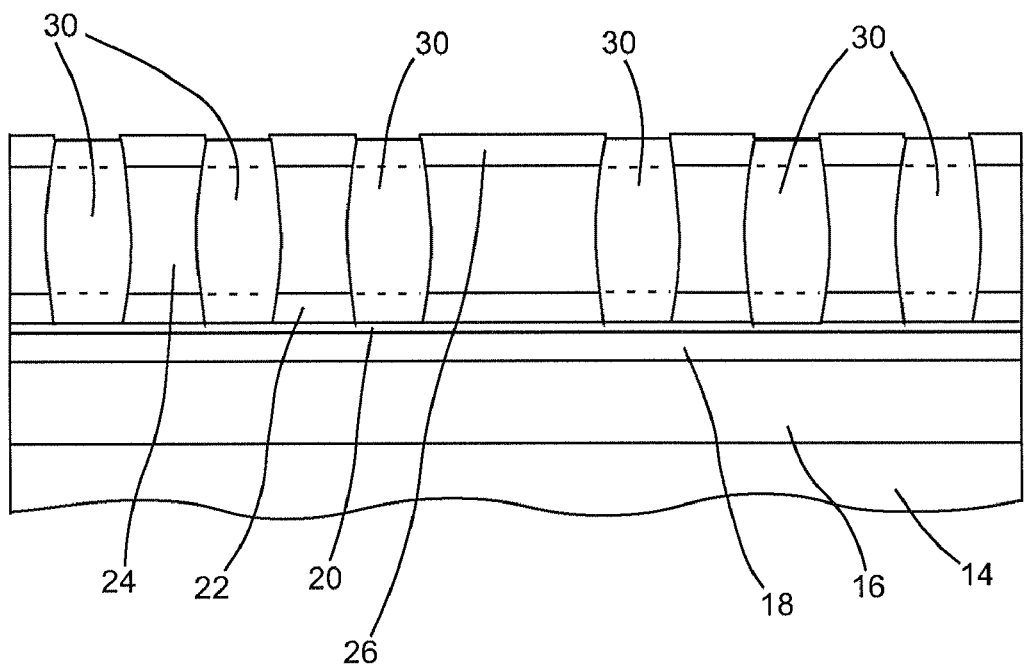
Figure 3G:
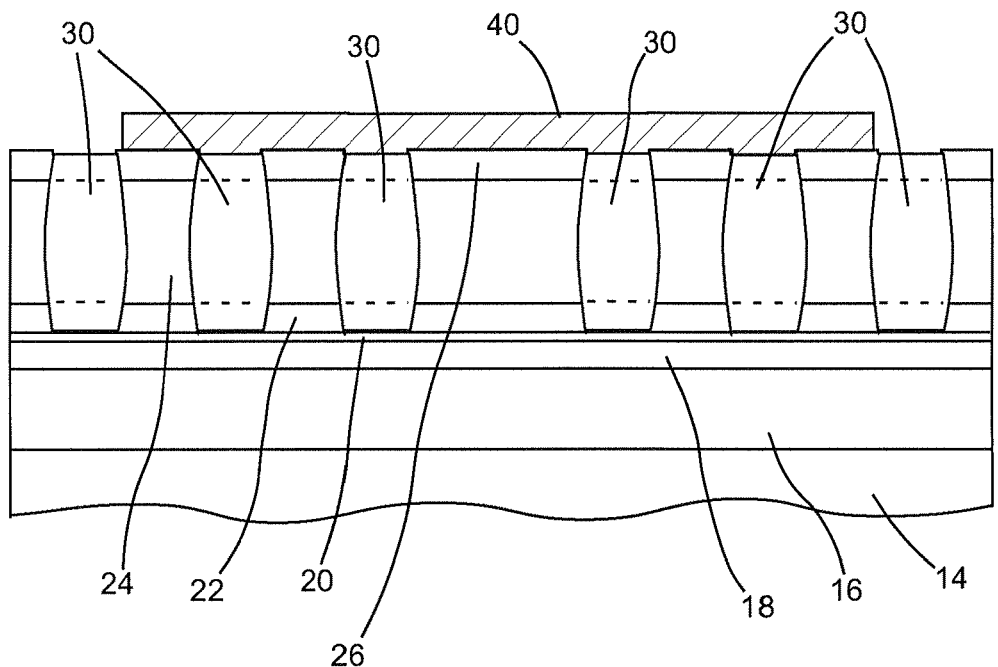
Figure 3H:
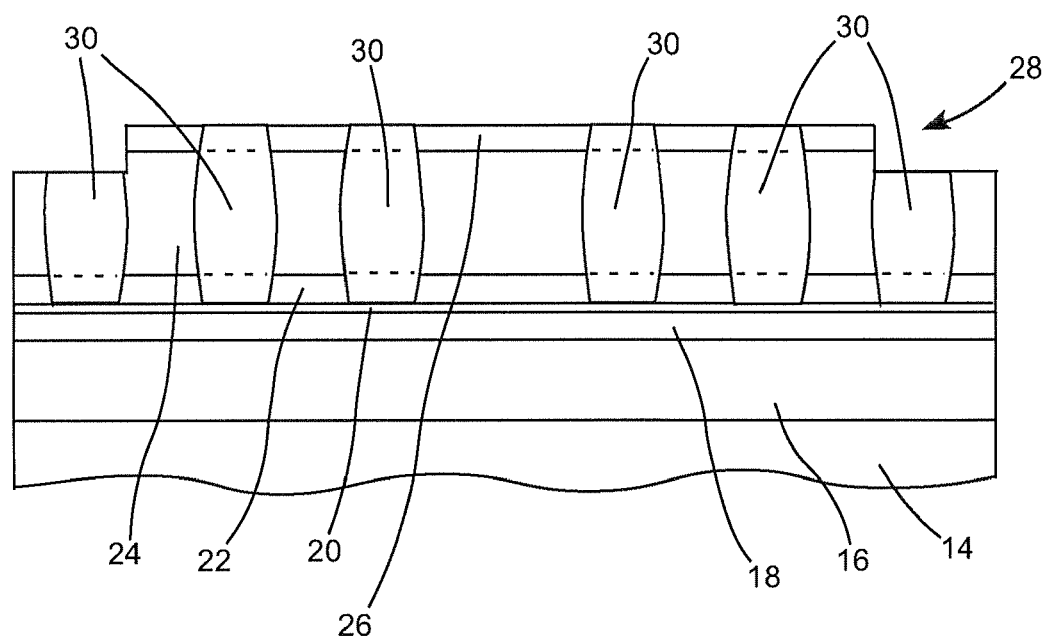

After the diffusion is complete, layers 32, 36 and 38 are etched from the layer structure (see FIG. 3F). Next a layer 40 of silicon nitride is deposited over the layer structure in the region where the ridge and underlying resonator are desired (see FIG. 3G). In the regions not covered by the silicon nitride layer 40, all of the cap layer 26 and part of the cladding layer 24 are selectively etched away to form ridge 28, and the silicon nitride layer is then removed by selective etching to leave laser 10A (see FIG. 3H).

It should be noted that while the inventive edge-emitting semiconductor laser is described above with reference to a single such laser, principles of the invention are applicable to forming a linear array of such lasers on a single substrate. A linear array of edge-emitting semiconductor lasers is commonly referred to by practitioners of the art as a diode-laser bar. It should also be noted that the method described above with reference to FIGS. 3A-H for forming disordered regions 30 should not be construed as being the only method that can be used for forming disordered regions 30. It is possible that such regions could be formed by laser induced doping or selective laser disordering.

In summary the present invention is described above in terms of a preferred and other embodiments. The invention is not limited, however, to the embodiments described and depicted. Rather the invention is limited only by the claims appended hereto.

What is claimed is:

1. An edge-emitting semiconductor laser, comprising:
   a separate confinement heterostructure, the heterostructure having an active region, the active region including an active layer located between upper and lower waveguide layers, the active region being located between upper and lower cladding layers, and the active, waveguide and cladding layers being ordered crystalline epitaxially-grown layers;
   a cap layer located above a region of the upper cladding layer and defining a resonator region in the active region, the resonator region having a slow-axis parallel to the plane of the layers therein, a fast-axis perpendicular to the slow-axis, a longitudinal axis perpendicular to the fast- and slow-axes and first and second opposite sides parallel to the longitudinal axis; and
   a plurality of elongated disordered regions formed in at least one ordered crystalline waveguide layer of the active region, spaced apart from each other and extending parallel to the longitudinal axis of the resonator region, and located at least outside of the resonator region on both opposite sides thereof.

2. The edge-emitting semiconductor laser of claim 1, wherein the disordered regions have a refractive index lower that of the waveguide layer in which the disordered regions are located.

3. The edge-emitting semiconductor laser of claim 1, wherein the disordered regions are also located within the resonator region.

4. The edge-emitting semiconductor laser of claim 3, wherein the disordered regions are symmetrically distributed about the longitudinal axis of the resonator region with a first spacing between an innermost two of the disordered regions being greater than a second spacing between all other adjacent regions, thereby providing two periodically spaced groups of the disordered regions symmetrically disposed about the longitudinal axis of the resonator region.

5. The edge-emitting semiconductor laser of claim 1, wherein the disordered regions extend through the active region from the upper waveguide layer thereof into the lower waveguide layer thereof.

6. The edge-emitting semiconductor laser of claim 1, wherein the disordered regions outside the resonator region extend through the upper cladding layer into the upper waveguide layer.

7. The edge-emitting semiconductor laser of claim 1, wherein there are 10 of the disordered regions on each side of the resonator region.

8. The edge-emitting semiconductor laser of claim 1, wherein the layers of the heterostructure have an arrangement and composition for delivering radiation in a wavelength range between about 700 nm and 1100 nm, the disordered regions have a width between about 10 and 50 micrometers and are spaced-apart by a distance between about 70 and 100 micrometers.

9. The edge-emitting semiconductor laser of claim 8, wherein, the active layer has a composition $Al_zGa_{(1-z)}As$; the upper and lower waveguide layers have a composition $Al_yGa_{(1-y)}As$; and the upper and lower cladding layers have composition $Al_xGa_{(1-x)}As$, where $x>y>z$.

10. The edge-emitting semiconductor layer of claim 9, wherein the cap layer is a layer of p-type gallium arsenide.

* * * * *